US012777609B2

(12) United States Patent
Alvarado et al.

(10) Patent No.: US 12,777,609 B2
(45) Date of Patent: Oct. 27, 2026

(54) MANAGEMENT OF DISTRIBUTED SYSTEM DEPLOYMENT

(71) Applicant: Dell Products L.P., Round Rock, TX (US)

(72) Inventors: Daniel Alvarado, Pflugerville, TX (US); David L. Roper, Austin, TX (US); Ben John Sy, Austin, TX (US); Julian Yu-Hao Chen, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 25 days.

(21) Appl. No.: 19/002,934

(22) Filed: Dec. 27, 2024

(65) Prior Publication Data

US 2026/0190277 A1 Jul. 2, 2026

(51) Int. Cl.
*H05K 7/18* (2006.01)
*H05K 5/02* (2006.01)

(52) U.S. Cl.
CPC ............ *H05K 7/18* (2013.01); *H05K 5/0247* (2013.01)

(58) Field of Classification Search
CPC ........................................................ H05K 7/18
See application file for complete search history.

(56) References Cited

U.S. PATENT DOCUMENTS

2018/0368277 A1* 12/2018 Bachar ................. H05K 7/1489
2023/0337388 A1* 10/2023 Liao ..................... H05K 7/1491

* cited by examiner

*Primary Examiner* — Jerry Wu
(74) *Attorney, Agent, or Firm* — WOMBLE BOND DICKINSON (US) LLP

(57) ABSTRACT

Methods, systems, and devices are provided for deploying computing resources to a location. To do so, a rack system may include a rack, a bus bar, chassis housing data processing systems and/or power supplies, and a relocation mechanism. The bus bar positioned in the rack may distribute power to the data processing systems positioned in chassis while the chassis are positioned in operable positions in the rack. The relocation mechanism may be adapted to move the bus bar between a first position and a second position, the first position enabling a distribution of power. Once the rack system is obtained, the bus bar may be positioned in the second position using the relocation mechanism, for moving the rack system to the location. After the rack system is moved to the location, the bus bar may be moved in the first position to facilitate provisioning of desired computer implemented services.

20 Claims, 12 Drawing Sheets

MANAGEMENT OF DISTRIBUTED SYSTEM DEPLOYMENT

FIELD

Embodiments disclosed herein relate generally to management of data processing systems. More particularly, embodiments disclosed herein relate to systems and methods for managing deployment of data processing systems.

BACKGROUND

Computing devices may provide computer-implemented services. The computer-implemented services may be used by users of the computing devices and/or devices operably connected to the computing devices. The computer-implemented services may be performed with hardware components such as processors, memory modules, storage devices, and communication devices. The operation of these components may impact the performance of the computer-implemented services.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Figure 1A:
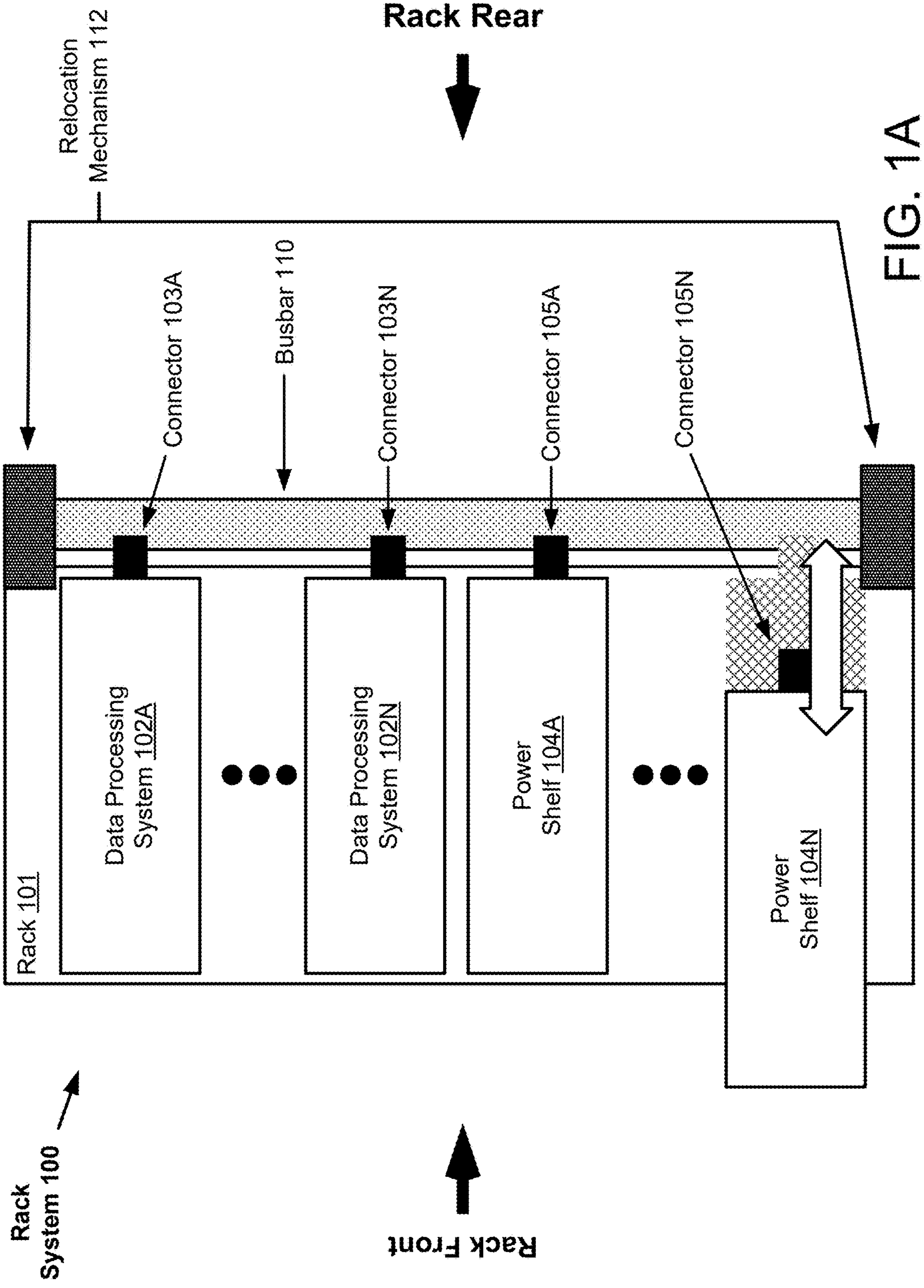
FIGS. 1A-1C show block diagrams illustrating systems in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods and systems for managing data processing systems in a distributed environment that may provide, at least in part, computer implemented services. The computer implemented services may be provided to any type and/or number of other devices and/or users of the data processing systems. Furthermore, the provided computer implemented services may be of any quantity and/or type of such services.

To provide the computer implemented services, data processing systems may include hardware components. For example, operation of these hardware components may facilitate various functionalities of a data processing system, thereby causing the data processing system to provide the computer implemented services.

To enable such operation of the hardware components, the hardware components may consume power required for such operation. This power may be provided by at least one power supply unit, such as any number of power supply units positioned with a power shelf to provide power to a power bus (e.g., busbar 110), the power bus then redistributing that power to any number of data processing systems housed in chassis positioned in a rack of a rack system.

However, such power supply units and/or such a power bus may be subjected to any number of unpredictable events (e.g., during deployment of the rack system), such as events that may negatively impact future distribution of power.

For example, should connection between any of the chassis and the busbar be deprecated and/or otherwise damaged while the rack system is in transit to a location for the deployment, the distribution of power (e.g., once the rack system is deployed) may become inefficient, unpredictable, and/or irreparable without significant and/or time-consuming replacements to the rack system. Consequently, such services as the computer implemented services may thereby be delayed and/or prevented entirely.

To decrease a likelihood of these negative impacts, a deployment framework may be leveraged. To do so, the deployment framework may be leveraged post-testing of the rack system once the rack system is intended for deployment to a location that may be based, for example, on a client intended to consume the computer implemented services.

This deployment framework may include (i) powering down the rack system, (ii) using chassis positioned in the rack of the rack system and a relocation mechanism to prepare the rack system for transit, (iii) upon the rack system reaching the location, using the chassis and the relocation mechanism to prepare the rack system for intended operation, (iv) powering the rack system, and (v) facilitating provisioning of desired computer implemented services using the powered rack system.

In an embodiment, a method for deploying computing resources to a location is provided.

The method may include obtaining a rack system that may include a busbar positioned to distribute power to data processing systems positioned in chassis that are housed in a rack of the rack system while the chassis are positioned in operable positions; the data processing systems; and a relocation mechanism adapted to move the busbar between a first position and a second position, while the busbar is in the first position the busbar is adapted to distribute power to the chassis, and while the busbar is in the second position the busbar is not adapted to distribute the power to the chassis; positioning the busbar in the second position using the relocation mechanism; while the busbar is positioned in the second position, moving the rack system to the location; and after the rack system is moved to the location, positioning the busbar in the first position to facilitate provisioning of desired computer implemented services.

The positioning of the busbar may include moving at least the chassis from the operable positions to inoperable positions to disconnect the data processing systems from the busbar; and while the data processing systems are disconnected, actuating the relocation mechanism.

The positioning of the busbar may further include, after actuating the relocation mechanism, moving the at least the chassis from the inoperable positions to the operable positions to secure the chassis in the rack for the moving of the rack system to the location.

The chassis may not be secured while in the inoperable positions.

The actuating of the relocation mechanism may include at least one selected from a group of actions consisting of removing mechanical connectors that secure the busbar to the rack in the first position; and applying force to a guide system that moves the busbar between the first position and the second position.

Each of the data processing systems may include a clip adapted to flow power from the busbar to a corresponding one of the data processing systems; while the busbar is in the first position and the chassis are in the operable positions, the clip is in direct physical contact with the busbar; and while the busbar is not in the first position the clip is not in direct physical contact with the busbar.

The rack system may further include a power shelf adapted to supply device level power to the busbar.

The busbar may be adapted to distribute the device level power to all of the data processing systems.

The busbar may include two electrical bars adapted to be positioned vertically at a rear of the chassis to distribute the device level power to the data processing systems, and the busbar comprises a clip compatible interface to which the power shelf and the data processing systems are adapted to interface.

Each of the two electrical bars may include a conductive coating susceptible wear via mechanical abrasion, and the two electrical bars are not adapted to carry force as part of the rack system.

In an embodiment, a rack system is provided. The rack system may include the relocation mechanism and the busbar such that the deployment framework may be leveraged by the rack system while deploying the computing resources to the location.

Turning to FIG. 1A, a block diagram illustrating a system (e.g., rack system 100) in accordance with an embodiment is shown. The system shown in FIG. 1A may be a distributed system that provides computer implemented services.

These services may include any type and/or quantity of services. These services may include, for example, database services, data processing services, electronic communication services, and/or any other services that may be provided by one or more computing devices.

Other types of services may be provided by the system shown in FIG. 1A without departing from embodiments disclosed herein.

To provide these services, the system may include any number of data processing systems (e.g., computing devices), such as data processing systems 102A through 102N, positioned in a rack (e.g., 101) as shown in FIG. 1A. Each of these data processing systems may include any quantity of hardware components. These components may include, for example, processors, memory modules, storage devices, communications devices, and/or any other type of component whose respective operation may facilitate various functionalities of the data processing systems. By facilitating such functionalities of the data processing systems, operation of any of these components may cause the services to be provided.

To enable such operation of the hardware components, the hardware components may consume power required for such operation. This power may be provided by one or more power supply units, such as any number of power supply units positioned in an enclosure (e.g., a chassis) of a power shelf. For example, this power shelf may be one of any number of power shelves (e.g., 104A through 104N) positioned in rack 101 that may collectively provide power to a power bus (e.g., busbar 110) positioned towards a rear of rack 101. This power bus, once provided the power, may redistribute the power to any number of chassis positioned in rack 101, each of these chassis at least partially housing at least one of the data processing systems.

However, the any number of power supply units and/or the power bus may be subjected to any number of unpredictable events, such as events that may negatively impact future distribution of power.

For example, should connections between the power bus and any of the chassis be deprecated and/or otherwise damaged, power components responsible for the distribution of power may become inefficient, unpredictable, and/or irreparable without significant and/or time-consuming replacements to the rack system. Consequently, should the power required for enabling such operation be inconsistently available (e.g., due to the deprecation and/or any occurrence of damage), if available at all, the data processing systems may not be capable of drawing power required to enable respective operation and/or may not be capable of otherwise providing the computer implemented services. Such services may thereby be delayed and/or prevented entirely.

To increase a likelihood of providing computer implemented services as expected and/or desired by a consumer of such services (e.g., an entity associated with the data processing systems in the rack), and decrease a likelihood of systems that may provide such services being negatively impacted, a distributed system (e.g., rack system 100) may include components such as those illustrated and discussed with regard to FIG. 1A, below.

In general, embodiments disclosed herein relate to systems, devices, and methods for deploying computing resources to a location that may provide computer implemented services is provided. To do so, a deployment framework may be leveraged. This leveraging, for example, may occur post-testing of rack system 100 once rack system 100 is intended and ready for deployment to the location, the location being based, for example, on a client (e.g., the consumer) intended to consume the computer implemented services.

This deployment framework may include (i) powering down the rack system, (ii) using chassis positioned in the rack of the rack system and a relocation mechanism to prepare the rack system for transit, (iii) upon the rack system reaching the location, using the chassis and the relocation mechanism to prepare the rack system for intended operation, (iv) powering the rack system, and (v) facilitating provisioning of desired computer implemented services using the powered rack system.

Therefore, this deployment framework may decrease a likelihood of a rack system (e.g., 100) being negatively impacted throughout transit to the location (e.g., deployment). More specifically, for example, power components of the rack system may be less likely to be physically damaged when this deployment framework is facilitated.

To provide the above noted functionality, the rack system of FIG. 1A (e.g., 100) may include rack 101, data processing systems 102A-102N, connectors 103A-103N, power shelves 104A-104N, connectors 105A-105N, busbar 110, and/or relocation mechanism 112. Each of these is discussed below.

It will be appreciated that even though illustrated to include just two data processing systems (e.g., 102A and 102N), the system of FIG. 1A may include any number of data processing systems (e.g., 102A through 102N) not to be limited by embodiments discussed herein. Any of these systems may (i) include hardware components that consume power to facilitate respective operation, (ii) depend on a power source, such as one or more power shelves (e.g., 104A through 104N) and/or a power distributor (e.g., busbar 110), to provide the power, (iii) include management controllers (e.g., discussed further with regard to FIG. 1B), (iv) be stacked vertically with regard to one another in vertically aligned slots of rack 101, and (v) provide computer implemented services based on respectively facilitated operation of the hardware components.

To provide their functionality, data processing systems 102A and 102N may be implemented by, for example, two computing devices such as servers positioned (e.g., stacked) vertically in rack 101 with one another. For example, the rack may include a series of slots that are vertically positioned relative to one another (e.g., the vertically aligned slots), and each data processing system may be at least partially housed in a respective chassis adapted to be inserted into one of the slots, each chassis being further adapted to house hardware components of a respective data processing system.

As mentioned above, these data processing systems (102A and 102N) may include management controllers. These management controllers may facilitate operation of the corresponding hardware components by (i) providing instructions/commands for the hardware components as well as (ii) facilitating communications with other devices.

To provide their functionalities, these management controllers may be implemented with circuit card computer chips (e.g., such as processors).

Figure 1B:
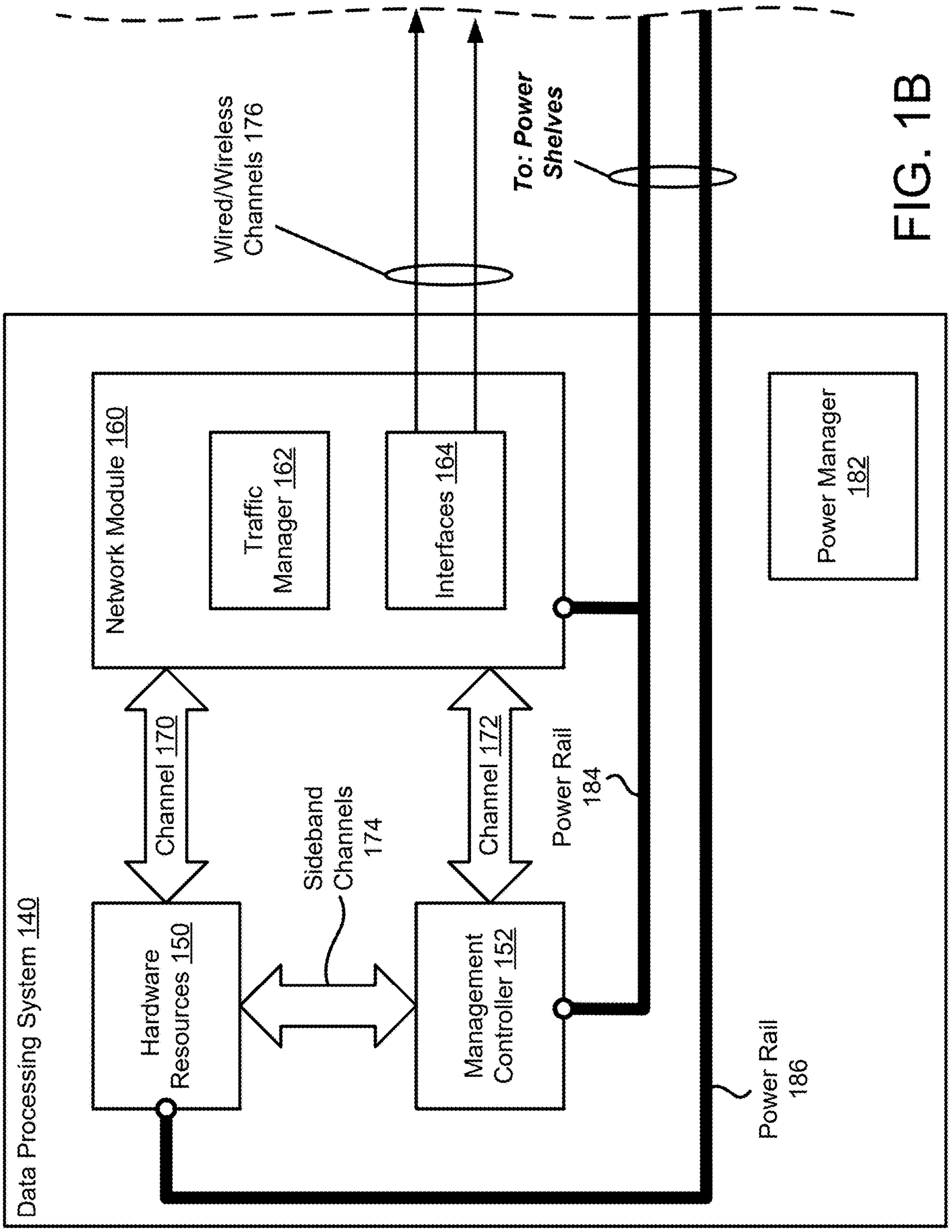
Figure 4:
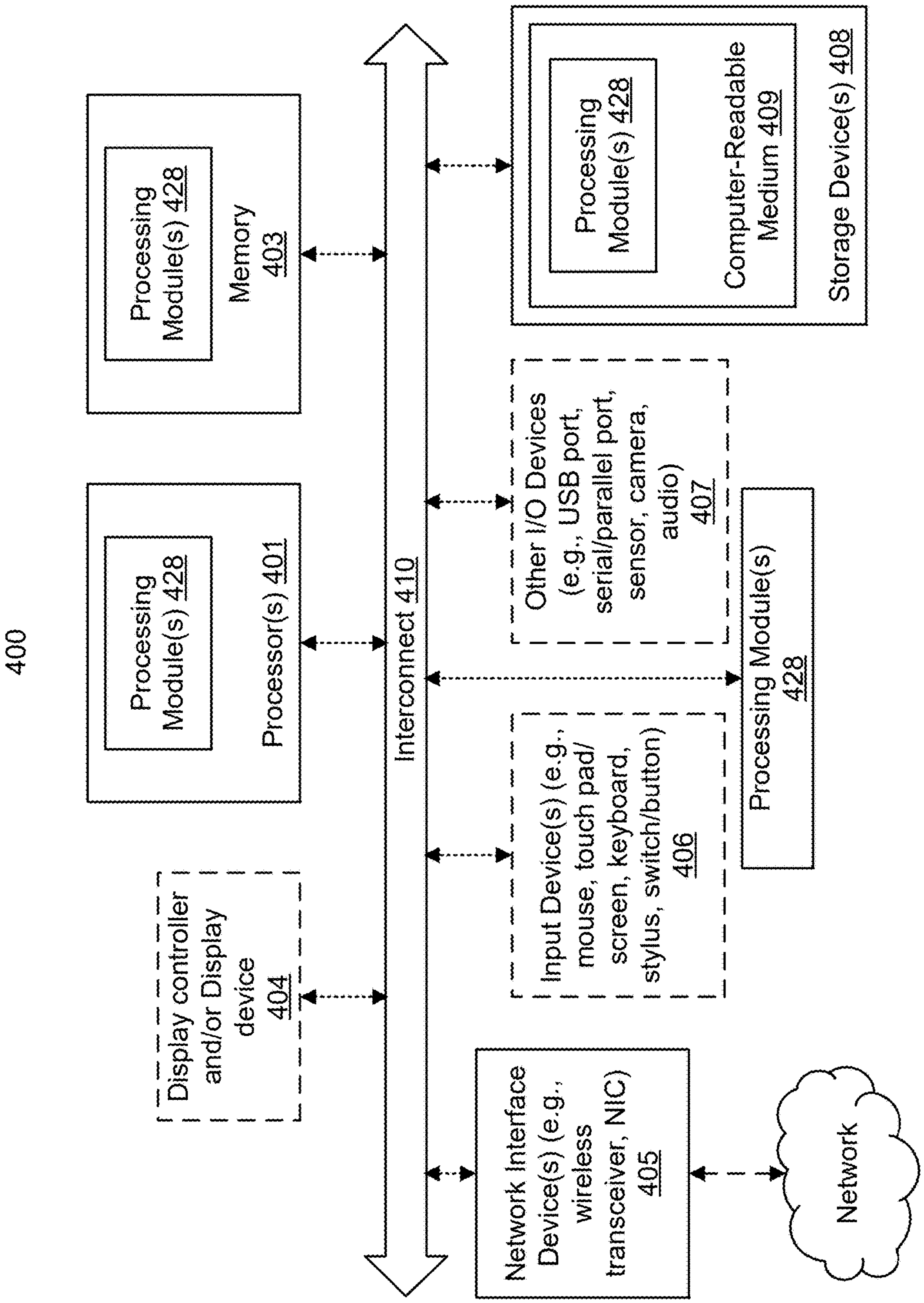
FIG. 4 shows a block diagram illustrating a data processing system in accordance with an embodiment.

For additional information regarding data processing systems, refer to FIGS. 1B and 4.

It will be appreciated that even though illustrated in FIG. 1A to include just two power shelves (e.g., 104A and 104N), the system of FIG. 1A may include any number of power shelves (e.g., 104A through 104N) not to be limited by embodiments discussed herein. Any of these power shelves may (i) include any number of power supplies, and (ii) provide power to the power bus (e.g., busbar 110).

To provide their functionality, power shelves 104A-104N may be implemented by enclosures (e.g., other/additional chassis) adapted to house and secure power supply units that may be positioned within their respective interiors. These enclosures may also facilitate, at least in part, physical connection with, for example, the power bus (e.g., the power bus being positioned and adapted to relay (provide) power to the rest of rack system 100).

Figure 1C:
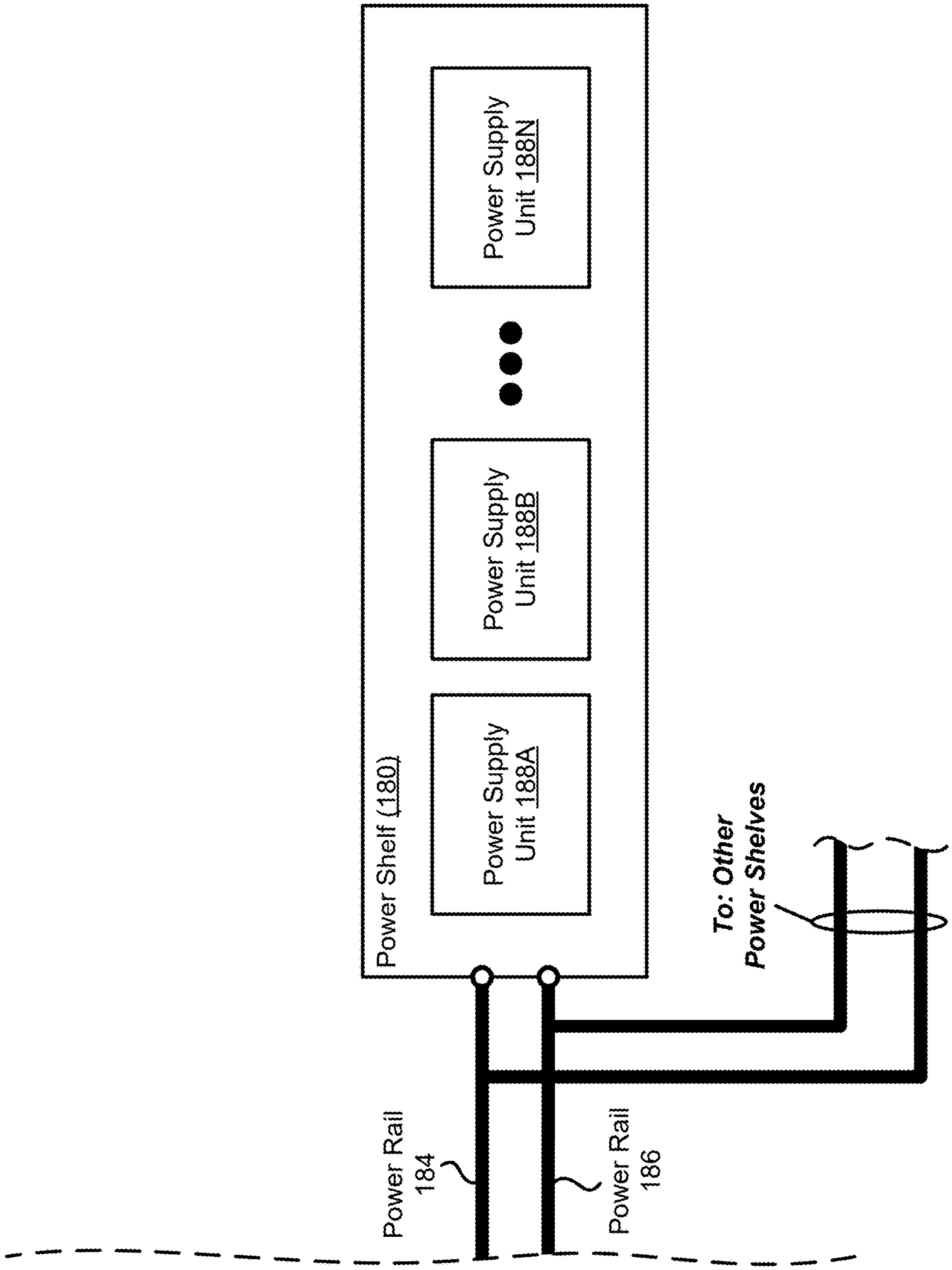

For additional information regarding power shelves, refer to FIG. 1C.

To further facilitate the connections between the power bus and the chassis housing the data processing systems and/or the other chassis housing power supply units, rack system 100 may include (i) first power connections (e.g., connectors 105A-105N) that enable the provision of power to the power bus from the power shelves, and (ii) second power connections (e.g., connectors 103A-103N) that enable distribution of the provided power to the data processing systems (e.g., that enable the hardware components to draw power as needed).

It will be appreciated, that although discussed with regard to rack system 100 including these power connections, (i) any one of the first power connections may be included in, and/or may be extensions of, the other chassis housing power supply units, and (ii) any one of the second power connections may be included in, and/or may be extensions of, the chassis housing hardware components of the data processing systems.

To provide their functionalities, these power connections may be implemented by conductive materials shaped (and/or otherwise formed) to facilitate physical contact with other conductive materials so as to provide a path for power distribution between components of rack system 100, thereby contributing to the power buss' facilitation of power distribution throughout rack system 100.

The power bus (e.g., busbar 110) may, as previously discussed, (i) distribute power provided by the power shelves, (ii) enable the data processing systems (and therefore components thereof) to draw the power provided by the power shelves, and (iii) be positioned with the rear of rack 101.

To further facilitate the distribution of power, the power bus may (iv) be positioned in a first position wherein the power connections (e.g., 103A-103N and 105A-105N) are in direct physical contact with busbar 110 while the chassis of both the data processing systems and the power shelves are in operable positions within rack 101 (e.g., positioned in slots of rack 101 and pushed towards the rack rear within those slots). For example, data processing systems 102A and 102N and power shelf 104A are depicted in FIG. 1A at their operable positions. Additionally, for example, power shelf 104N is depicted in FIG. 1A as not being in its respective operable position (e.g., the two-way white arrow between busbar 110 and power shelf 104N indicating an orientation in which any of these chassis may slide into or out of the slots in rack 101, the hatched outline behind the two-way arrow illustrating the respective operable position for power shelf 104N.

It will be appreciated that, as shown in FIG. 1A, while in respective operable positions in rack 101, corresponding power connections of respective chassis may have physical contact with busbar 110. Alternatively, as shown in FIG. 1A, a power connection (e.g., connector 105N) may not make physical contact with busbar 110 if a corresponding chassis (e.g., power shelf 104N) is not in its respective operable position, the operable positions being at the rear of rack 101 (e.g., placed into the slots and pushed a far toward the rear of rack 101 as possible).

As previously mentioned, however, power components such as the power supply units, power connections, and/or the power bus may be subjected to any number of unpredictable events, such as events (e.g., during transit of the rack system) that may negatively impact future distribution of power.

For example, should connections between the power bus and any of the chassis, such as the power connections discussed above, be deprecated and/or otherwise take damage and/or inflict damage (e.g., inflict damage on busbar 110), power components such as the power bus may, with regard to power distribution functionality, become inefficient, unpredictable, and/or irreparable without significant and/or time-consuming replacements to the rack system.

Such deprecation and/or damage may, for example, occur during deployment of rack system 100 (e.g., as rack system 100 is in transit to an intended location). In such cases of the power distributing functionality being negatively impacted, rack system 100's capability of providing computer implemented services may result in such services instead being delayed and/or prevented entirely.

In an attempt to prevent such negative impacts, the power bus may also (v) be adapted for repositioning between the first position and a second position in which the power connections (e.g., 103A-103N and 105A-105N) do not make physical contact with the power bus (e.g., busbar 110) while the chassis of both the data processing systems and the power shelves are in the operable positions within rack 101. To provide its functionality, the power bus may be implemented by busbar 110.

To facilitate the repositioning of the power bus between the first position and the second position, rack system 100 may further include relocation mechanism 112. For example, relocation mechanism may (i) enable detachment of the power bus from the first position and/or the second position such that the power bus may be repositioned, (ii) enable fixedly secure attachment of the power bus to the first position and/or the second position, and (iii) facilitate repositioning of the power bus while the power bus is not fixedly attached to either the first position and/or the second position.

To provide its functionality, relocation mechanism 112 may be implemented by any number of mechanical component combinations that may facilitate fastening and/or repositioning of busbar 110 not to be limited by embodiments discussed herein. For example, relocation mechanism 112 may be implemented by fasteners, sliding rails, bolts, hinges, locks, springs, etc.

It will be appreciated that relocation mechanism 112 may include any number of sub-portions not to be limited by embodiments discussed herein. For example, these sub-portions may be separated by any distance from one another while still being part of rack system 100. For example, as shown in FIG. 1A, relocation mechanism 112 may include two sub-portions (e.g., a top sub-portion that is proximate to a rack ceiling of rack 101, and a bottom sub-portion that is proximate to a rack bottom of rack 101), each being located on opposite ends of busbar 110 from one another.

By including the aforementioned (e.g., discussed above) components, rack system 100 may enable the leveraging of the deployment framework. In doing so, the likelihood of the rack system providing the computer implemented services as intended once successfully deployed at the location (e.g., at which the services may be expected and/or desired) may thereby be increased.

For additional information regarding repositioning the power bus between the first position and the second position, refer to FIGS. 2A-2F further below.

Figure 3:
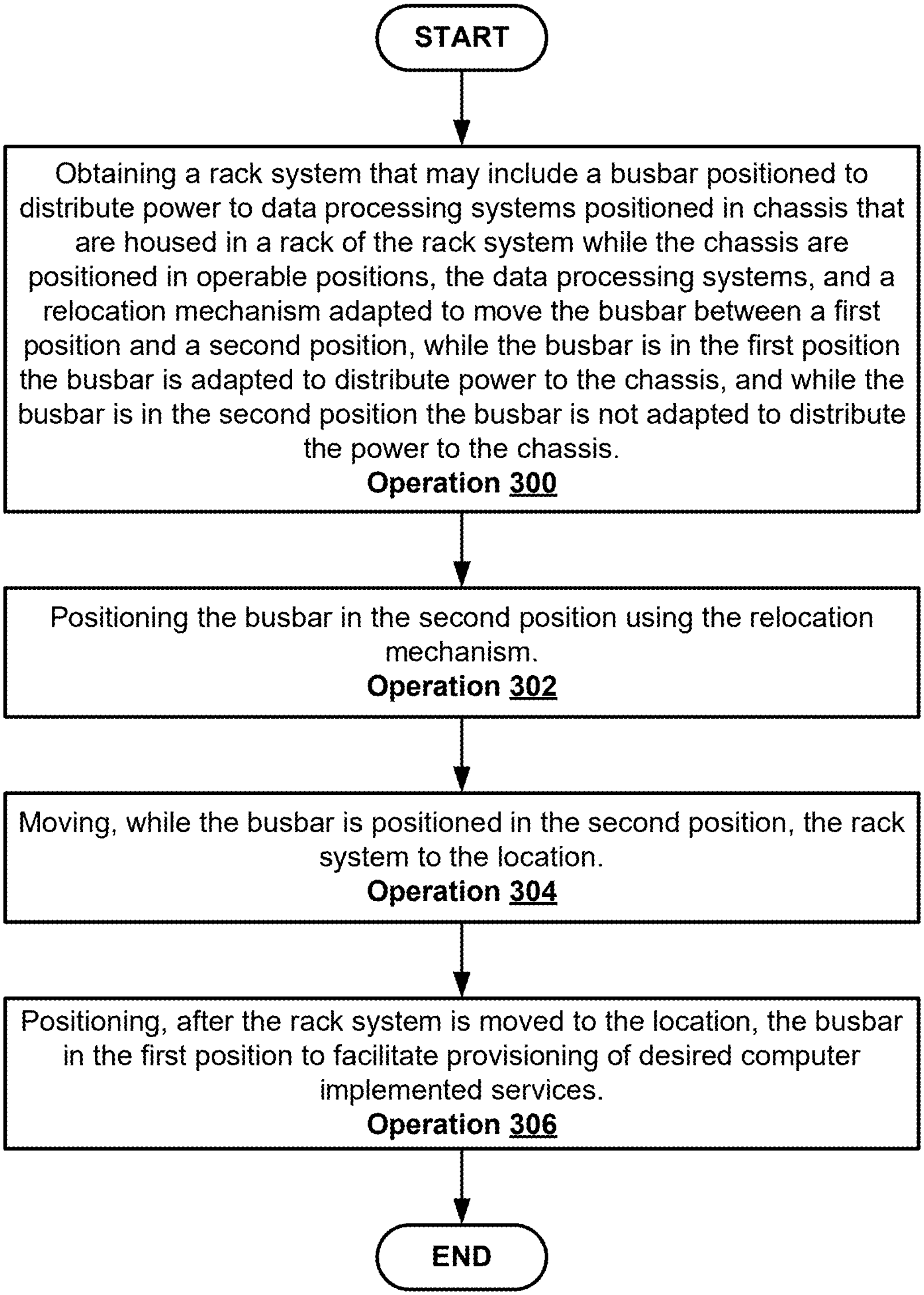
FIG. 3 shows a flow diagram illustrating a method for deploying computing resources to a location in accordance with an embodiment.

When providing their functionality, rack 101, data processing systems 102A-102N, connectors 103A-103N, power shelves 104A-104N, connectors 105A-105N, busbar 110, and/or relocation mechanism 112 may perform (and/or be involved in) all, or a portion, of the method shown in FIG. 3.

Any devices (and/or components thereof) included in the system of FIG. 1A may be implemented using a computing device (also referred to as a data processing system) such as a host or a server, a personal computer (e.g., desktops, laptops, and tablets), a “thin” client, a personal digital assistant (PDA), a Web enabled appliance, a mobile phone (e.g., Smartphone), an embedded system, local controllers, an edge node, and/or any other type of data processing device or system.

For additional details regarding computing devices, refer to FIG. 4.

Any of the components illustrated in FIG. 1A may be operably connected to each other (and/or components not explicitly illustrated) with a communication system utilized by data processing systems 102A-102N and/or other devices included in rack system 100.

In an embodiment, this communication system may include one or more networks that facilitate communication between any number of components. The networks may include wired networks and/or wireless networks (e.g., and/or the Internet). The networks may operate in accordance with any number and types of communication protocols (e.g., such as the internet protocol).

Thus, by enabling/facilitating such a framework as the deployment framework, there may be an increased likelihood of providing computer implemented services as expected and/or desired by, for example, the client for whom such services may be intended. This increased likelihood may be due to basing management of the rack system on the rack system's power related vulnerabilities throughout an environment (e.g., during transit to the location for deployment).

While illustrated in FIG. 1A as including a limited number of specific components, a system (e.g., the rack system) in accordance with an embodiment may include fewer, additional, and/or different components than those illustrated therein.

To further clarify embodiments disclosed herein, additional block diagrams in accordance with an embodiment are shown in FIGS. 1B-1C.

Turning to FIG. 1B, a diagram illustrating data processing system 140 in accordance with an embodiment is shown. Data processing system 140 may be similar to any of and/or a same data processing system as one of the data processing systems shown in FIG. 1A.

To provide computer implemented services, data processing system 140 may include any quantity of hardware resources 150. Hardware resources 150 may be in-band hardware components, and may include a processor operably coupled to memory, storage, and/or other hardware components.

The processor may host various management entities such as operating systems, drivers, network stacks, and/or other software entities that provide various management functionalities. For example, the operating system and drivers may provide abstracted access to various hardware resources. Likewise, the network stack may facilitate packaging, transmission, routing, and/or other functions with respect to exchanging data with other devices.

For example, the network stack may support transmission control protocol/internet protocol communication (TCP/IP) (e.g., the Internet protocol suite) thereby allowing the hardware resources 150 to communicate with other devices via packet switched networks and/or other types of communication networks.

The processor may also host various applications that provide the computer implemented services. The applications may utilize various services provided by the management entities and use (at least indirectly) the network stack to communication with other entities.

For example, to communicate with other entities, an application may generate and send communications to a network stack and/or driver, which may subsequently transmit a packaged form of the communication via channel 170 to a communication component, which may then send the packaged communication (in a yet further packaged form, in some embodiments, with various layers of encapsulation being added depending on the network environment outside of data processing system 140) to another device via any number of intermediate networks (e.g., via wired/wireless channels 176 that are part of the networks).

To reduce the likelihood of the applications and/or other in-band entities from being indirectly compromised by using various communication avenues, data processing system 140 may include management controller 152 and network module 160. Each of these components of data processing system 140 is discussed below.

Management controller 152 may be implemented, for example, using a system on a chip or other type of independently operating computing device (e.g., independent from the in-band components, such as hardware resources 150 of a host such as data processing system 140). Management controller 152 may provide various management functionalities for data processing system 140. For example, management controller 152 may monitor various ongoing processes performed by the in-band components, may manage power distribution, thermal management, and/or other functions of data processing system 140.

To do so, management controller 152 may be operably connected to various components via sideband channels 174 (in FIG. 1B, a limited number of sideband channels are included for illustrative purposes, it will be appreciated that management controller 152 may facilitate communication with other components via any number of sideband channels). The sideband channels may be implemented using separate physical channels, and/or with a logical channel overlay over existing physical channels (e.g., logical division of in-band channels). The sideband channels may allow management controller 152 to interface with other components and implement various management functionalities such as, for example, general data retrieval (e.g., to snoop ongoing processes), telemetry data retrieval (e.g., to identify a health condition/other state of another component), function activation (e.g., sending instructions that cause the receiving component to perform various actions such as displaying data, adding data to memory, causing various processes to be performed), and/or other types of management functionalities.

For example, management controller 152 may enable information from other devices to be provided to the application without traversing the network stack and/or management entities of hardware resources 150. To do so, the other devices may direct communications including the information to management controller 152. Management controller 152 may then, for example, send the information via sideband channels 174 to hardware resources 150 (e.g., to store it in a memory location accessible by the application, such as a shared memory location, a mailbox architecture, or other type of memory-based communication system) to provide it to the application. Similarly, processes may be used to facilitate outbound communications from the applications.

Management controller 152 may be operably connected to communication components of data processing system 140 via separate channels (e.g., 172) from the in-band components, and may implement or otherwise utilize a distinct and independent network stack (e.g., TCP/IP). Consequently, management controller 152 may communication with other devices independently of any of the in-band components (e.g., does not rely on any hosted software, hardware components, etc.).

To facilitate communication with other devices, data processing system 140 may include network module 160. Network module 160 may provide communication services for in-band components and out-of-band components (e.g., management controller 152) of data processing system. To do so, network module 160 may include traffic manager 162 and interfaces 164.

Traffic manager 162 may include functionality to (i) discriminate traffic directed to various network endpoints advertised by data processing system 140, and (ii) forward the traffic to/from the entities associated with the different network endpoints. For example, to facilitate communications with other devices, network module 160 may advertise different network endpoints (e.g., different media access control address/internet protocol addresses) for the in-band components and out-of-band components. Thus, other entities may address communications to these different network endpoints. When such communications are received by network module 160, traffic manager 162 may discriminate and direct the communications accordingly (e.g., over channel 170 or channel 172, in the example shown in FIG. 1B, it will be appreciated that network module 160 may discriminate traffic directed to any number of data units and direct it accordingly over any number of channels).

Accordingly, traffic directed to management controller 152 may never flow through any of the in-band components. Likewise, outbound traffic from the out-of-band component may never flow through the in-band components.

To support inbound and outbound traffic, network module 160 may include any number of interfaces 164. Interfaces 164 may be implemented using any number and type of communication devices which may each provide wired and/or wireless communication functionality. For example, interfaces 164 may include a wide area network card, a WiFi card, a wireless local area network card, a wired local area network card, an optical communication card, and/or other types of communication components. These components may support any number of wired/wireless channels 176.

Thus, from the perspective of an external device, the in-band components and out-of-band components of data processing system 140 may appear to be two independent network entities that may independently addressable and otherwise unrelated to one another.

To facilitate management of data processing system 140 over time, hardware resources 150, management controller 152 and/or network module 160 may be positioned in separately controllable power domains. By being positioned in these separately power domains, different subsets of these components may remain powered while other subsets are unpowered.

For example, management controller 152 and network module 160 may remain powered while hardware resources 150 is unpowered. Consequently, management controller 152 may remain able to communication with other devices even while hardware resources 150 are inactive. Similarly, management controller 152 may perform various actions while hardware resources 150 are not powered and/or are otherwise inoperable, unable to cooperatively perform various process, are compromised, and/or are unavailable for other reasons.

To implement the separate power domains, data processing system 140 may utilize a power source of rack system 100 such as a power shelf (e.g., at least one of 104A-104N, and/or 180 shown and discussed further below with regard to FIG. 1C) that supply power to the previously mentioned power bus, the power bus (e.g., busbar 110) separately supplying power to power rails (e.g., 184, 186) that power the respective power domains. Power from the power bus, and therefore the power shelf, may be selectively provided to the separate power rails to selectively power the different power domains based on power drawn by data processing system 140. A power manager (e.g., 182) may manage power drawn by data processing system 140 from the power bus (and therefore, power shelf 180) that is supplied through the power rails. Management controller 152 may cooperate with power manager 182 to manage supply of power to these power domains.

In FIG. 1B, an example implementation of separate power domains using power rails 184-186 is shown. The power rails may be implemented using, for example, power connections (e.g., 103A-103N and 105A-105N) that connect respective chassis of the data processing systems and power shelves to respective portions of busbar 110 as depicted in FIG. 1A, or other types of transmission elements capable of distributing electrical power. While not shown, it will be appreciated that the power domains may include various power management components (e.g., fuses, switches, etc.) to facilitate selective distribution of power within the power domains.

Turning to FIG. 1C, a diagram illustrating power shelf 180 (e.g., as discussed with regard to FIG. 1B) in accordance with an embodiment is shown.

To enable data processing system 140 to provide computer implemented services, power shelf 180 may include any quantity of power supply units (e.g., 188A-188N) that are positioned with one another inside power shelf 180 such that they may collectively provide power to be consumed by, for example, the components of data processing system 140 in addition to any other data processing systems positioned in the rack (e.g., 102A through 102N). For example, these power supply units may provide the power drawn by data processing system 140 via power rails 184 and 186 (e.g., the power connections and the power bus (e.g., busbar 110)) operably connecting power shelf 180 to data processing system 140.

In FIGS. 1B-1C, an example implementation of separate power domains using power rails 184-186 is shown. The power rails may be implemented using, for example, busbars (e.g., 110) or other types of transmission elements capable of distributing electrical power. While not shown, it will be appreciated that the power domains may include various power management components (e.g., fuses, switches, etc.) to facilitate selective distribution of power within the power domains.

It will be appreciated that in some cases, these power rails may further distribute power from additional power shelves and/or to additional data processing systems, as shown in FIG. 1A-1C.

While illustrated in FIGS. 1A-1C as including a limited number of specific components, a system in accordance with an embodiment may include fewer, additional, and/or different components than those illustrated therein.

To further clarify embodiments disclosed herein, structural diagrams in accordance with an embodiment are shown in FIGS. 2A-2F. These structural diagrams may illustrate structural components within the system of FIG. 1A that may contribute to the deployment framework as previously discussed.

Figure 2A:
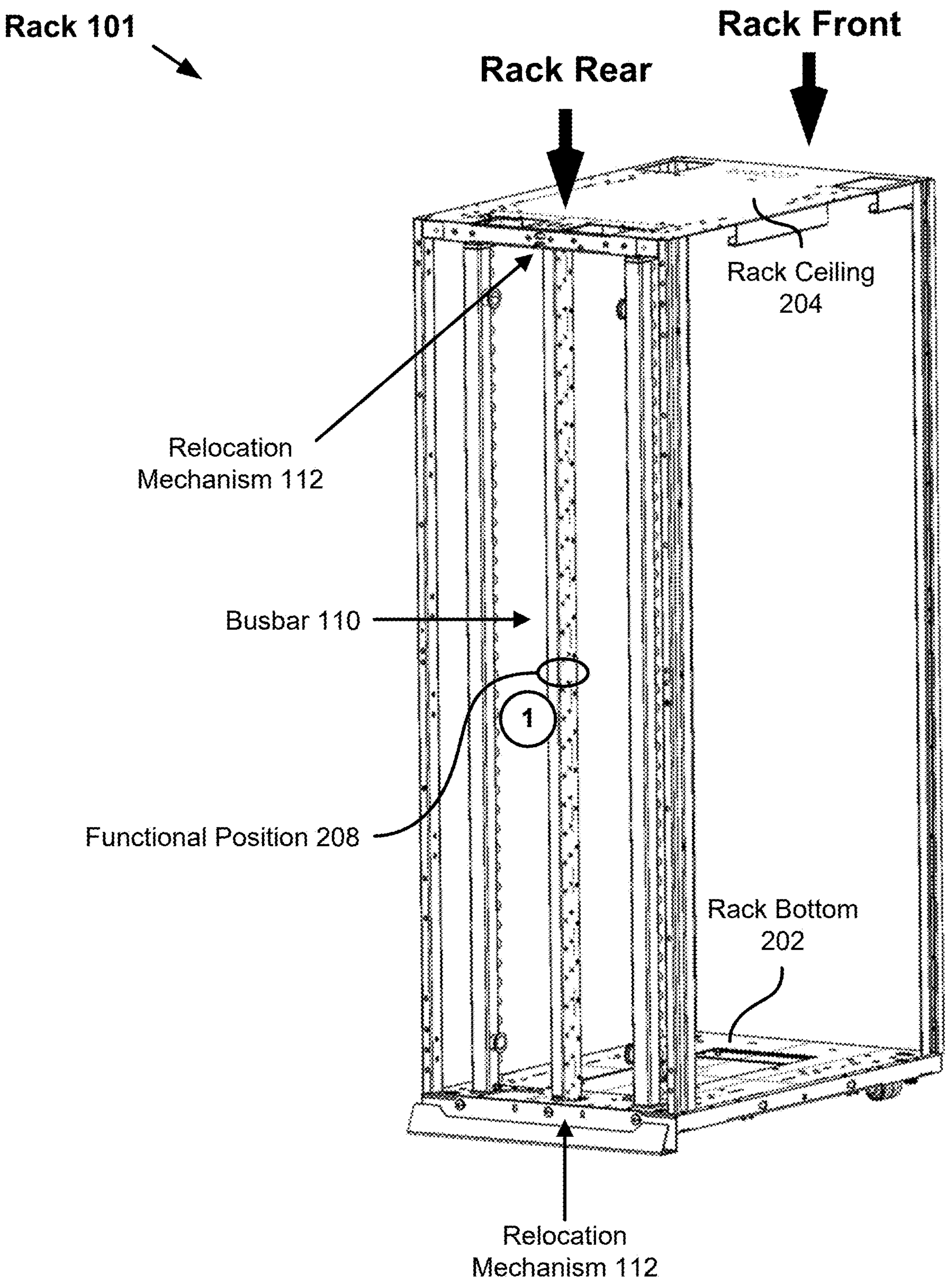
FIGS. 2A-2G show structural diagrams of a system in accordance with an embodiment.
Figure 2B:
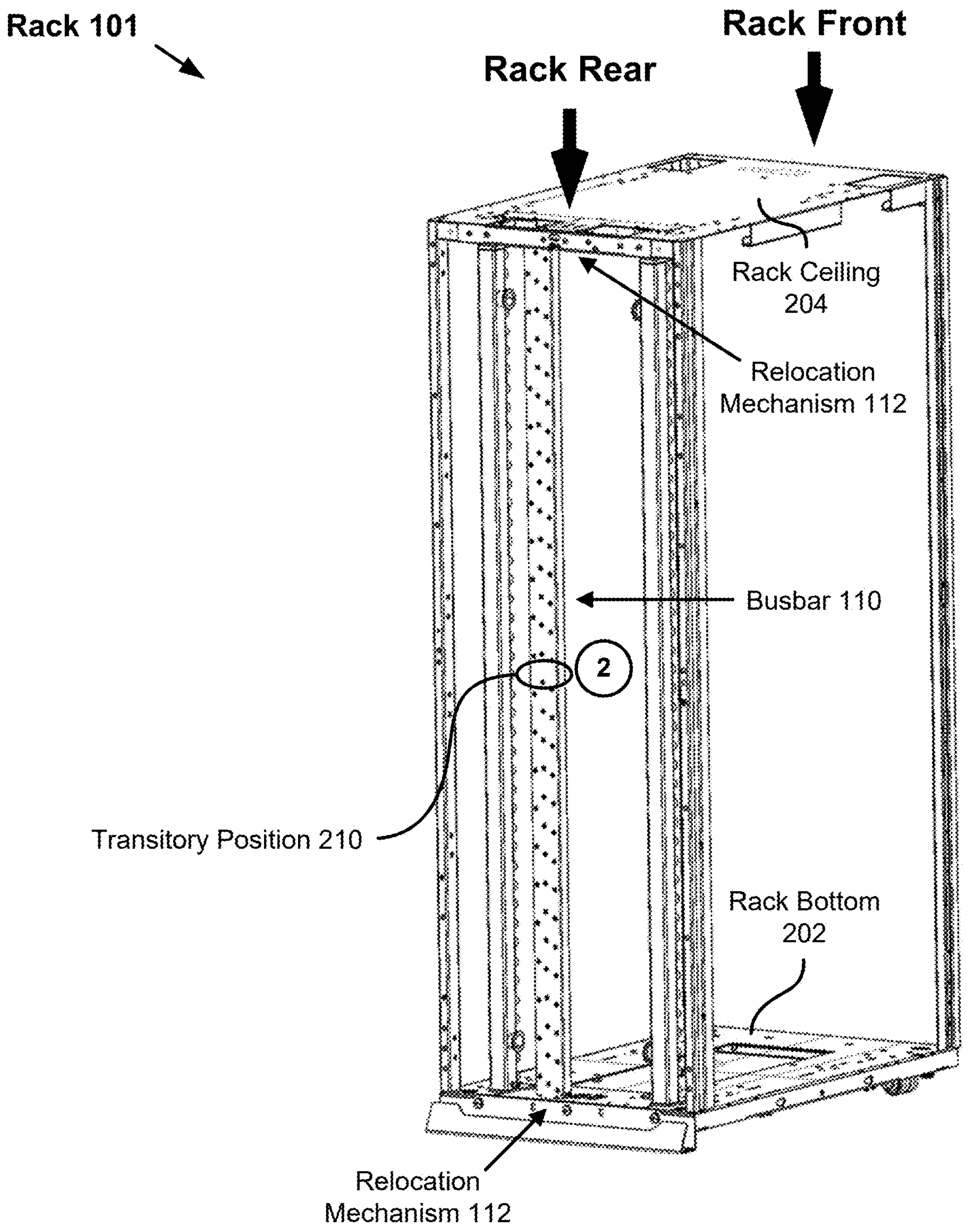

Turning to FIGS. 2A-2B, a first structural diagram and a second structural diagram in accordance with an embodiment are shown, respectively. The first and the second structural diagrams may each provide a viewpoint of a rear of rack 101 facing out of the page at an angle, a bottom of the rack (rack bottom 202) depicted as closer to a bottom of the page than a top of the rack (rack ceiling 204), the top of the rack being depicted closer towards a top of the page.

Turning to FIG. 2A, the first structural diagram in accordance with an embodiment is shown. The first structural diagram may illustrate structural components within the system of FIG. 1A that may contribute to the deployment framework.

As previously discussed, busbar 110 (e.g., the power bus) may be adapted for repositioning between the first position and the second position (both discussed previously with regard to FIG. 1A). As shown in FIG. 2A, this first position may be depicted by functional position 208.

For example, while busbar 110 is at functional position 208, physical contact may be facilitated between the previously discussed power connections and the conductive surfaces of busbar 110 (while the chassis of data processing systems and power shelves are in their respective operable positions).

Turning to FIG. 2B, the second structural diagram in accordance with an embodiment is shown. This second structural diagram may illustrate structural components within the system of FIG. 1A that may contribute to the deployment framework.

As previously discussed, busbar 110 (e.g., the power bus) may be adapted for repositioning between the first position and the second position. As shown in FIG. 2B, this second position may be depicted by transitory position 210.

While busbar 110 is at transitory position 210, physical contact may be prevented between the conductive surfaces of busbar 110 and any other conductive materials (and/or any materials/components) of rack 101 (with an exception of relocation mechanism 112 and any components utilized by relocation mechanism 112 to provide its functionality) in order to prevent accidental distribution of power and/or physical damage caused by friction between physically in-contact surfaces within the rack system during deployment to the location.

To facilitate the repositioning between the first position and the second position, the rack system may include relocation mechanism 112. Relocation mechanism 112 may be implemented in numerous ways such as any number of mounting features. For example, such implementations are discussed below with regard to FIGS. 2C-2D.

It will be appreciated that in FIGS. 2A-2B, the first position and the second position are further indicated by circled numerals 1 and 2, respectively. It will be further appreciated that these circled numerals are used similarly in FIGS. 2C-2G, further below.

Figure 2C:
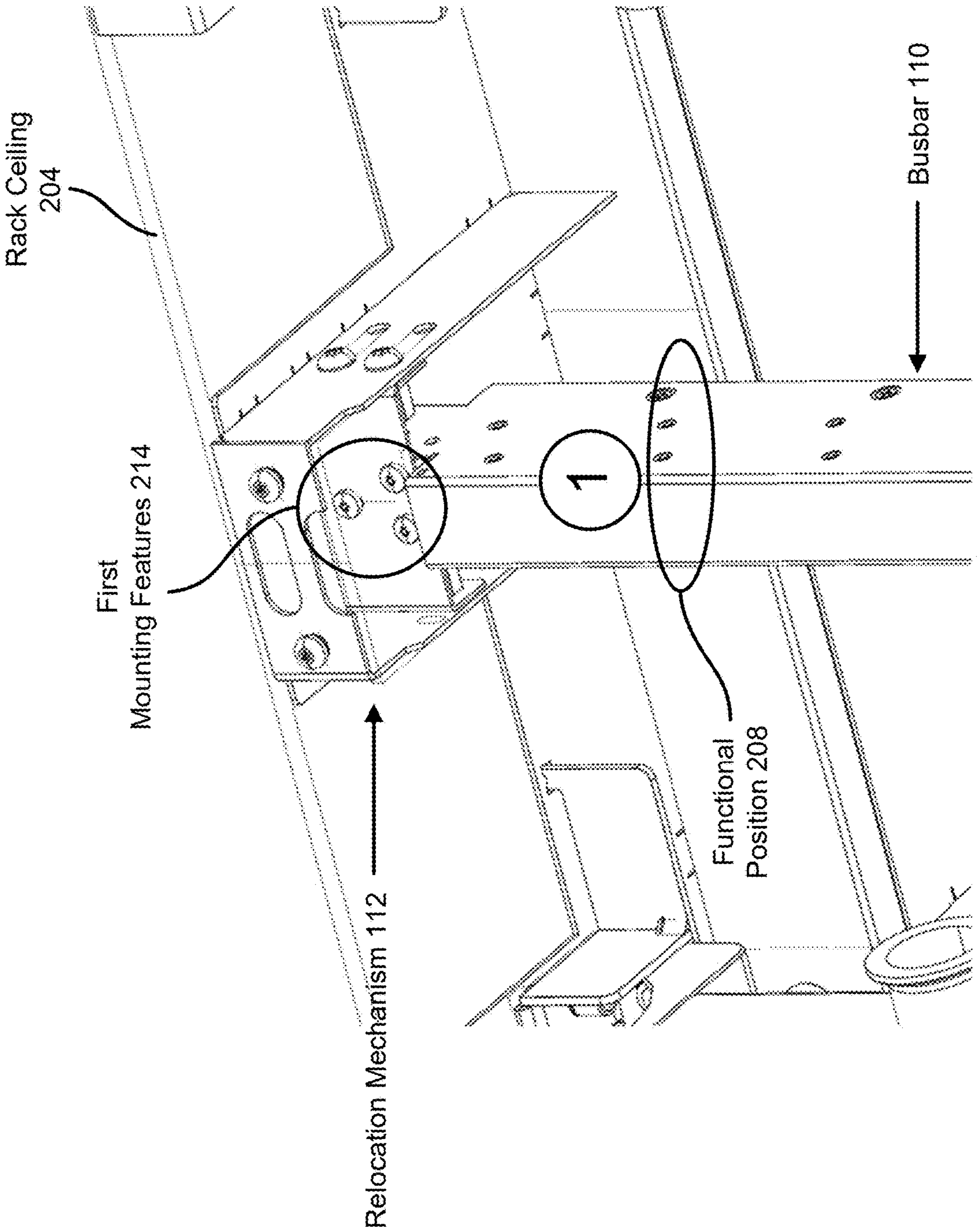
Figure 2D:
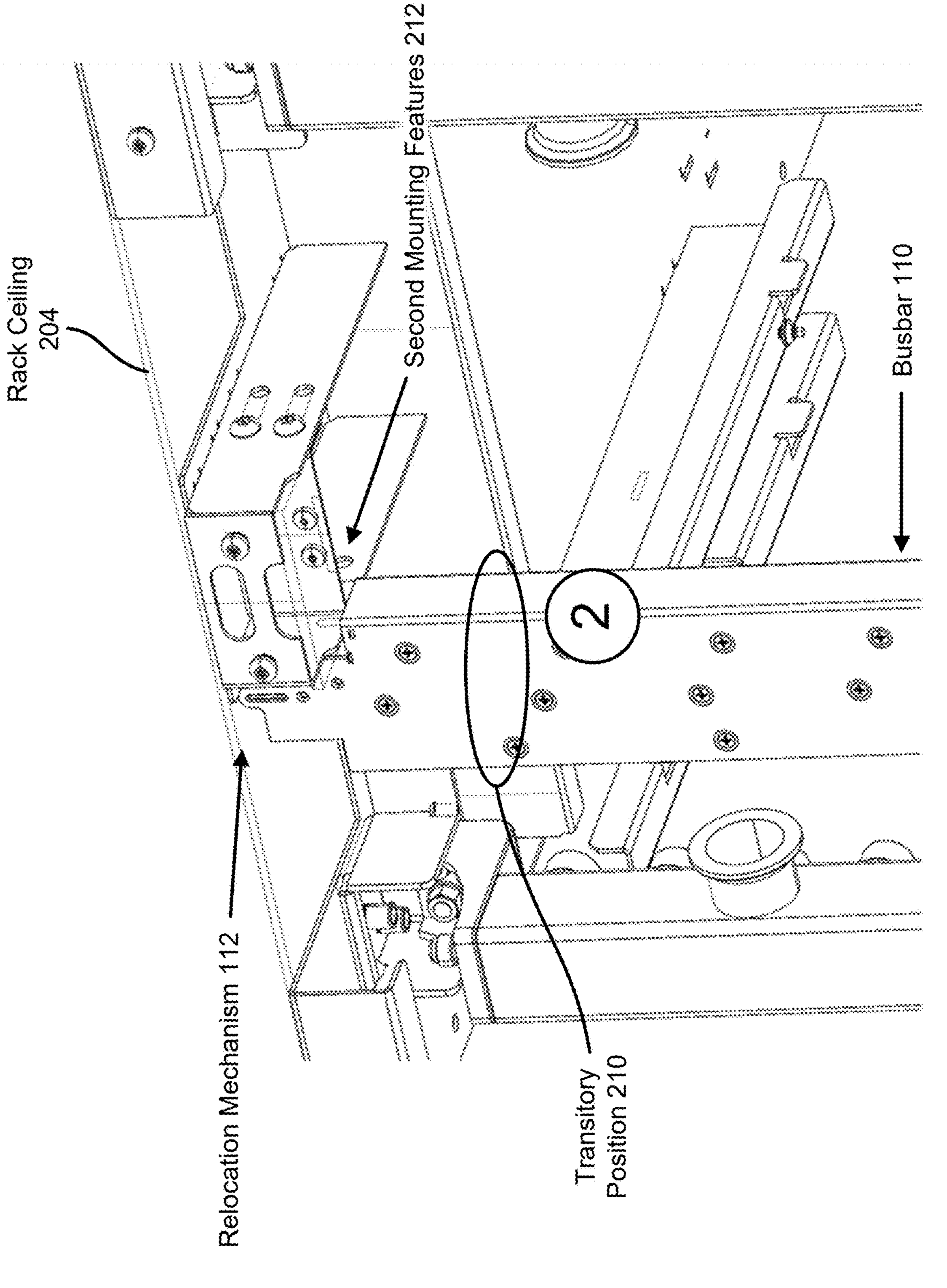

Turning to FIGS. 2C-2D, a third structural diagram and a fourth structural diagram in accordance with an embodiment are shown, respectively. The third and the fourth structural diagrams may each illustrate an expanded view of those depicted in FIGS. 2A and 2B, respectively. This expanded view may be of a top portion of relocation mechanism 112 shown in FIGS. 2A and 2B.

Turning to FIG. 2C, the third structural diagram in accordance with an embodiment is shown. The third structural diagram may illustrate structural components within the system of FIG. 1A that may contribute to the deployment framework.

As previously discussed, relocation mechanism 112 may be implemented by any number of mounting features. For example, it will be appreciated that relocation mechanism 112 may include any number of sub-portions that may each correspond to a respective set of mounting features such as those discussed below.

As shown in FIG. 2C, for example, relocation mechanism 112 may be implemented, at least in part, by a first sub-portion of the sub-portions. This first sub-portion may include first mounting features 214, proximate to rack ceiling 204 (e.g., in contrast to other sub-portions that may instead be proximate to rack bottom 202).

For example, the third structural diagram (depicted in FIG. 2C) may illustrate busbar 110 in functional position 208 (also referred to as the first position in above discussions). As shown in FIG. 2C, the first sub-portion of relocation mechanism 112 may include first mounting features 214. First mounting features 214 may be adapted to fasten, at least in part, busbar 110 to the first position as illustrated. First mounting features 214 may be implemented by, for example, bolts and/or bolt holes that align with holes on busbar 110 such that the first position may be facilitated (e.g., when the indicated bolts of first mounting features 214 are used to bolt busbar 110 to the correspondingly indicated bolt holes).

Turning to FIG. 2D, the fourth structural diagram in accordance with an embodiment is shown. The fourth structural diagram may illustrate structural components within the system of FIG. 1A that may contribute to the deployment framework.

As previously discussed, relocation mechanism 112 may be implemented by any number of mounting features. As shown in FIG. 2D, for example, relocation mechanism 112 may be implemented, at least in part, by a second sub-portion of the sub-portions. This second sub-portion may include second mounting features 212 proximate to rack ceiling 204 (e.g., this proximation being similar to first mounting features 214 and also in contrast to other sub-portions that may instead be proximate to rack bottom 202).

For example, the fourth structural diagram (depicted in FIG. 2D) may illustrate busbar 110 in transitory position 210 (also referred to as the second position in above discussions). As shown in FIG. 2D, the second sub-portion of relocation mechanism 112 may include second mounting features 212. Second mounting features 212 may be adapted to fasten, at least in part, busbar 110 to the second position as illustrated. Similar to first mounting features 214, second mounting features 212 may be implemented by, for example, bolts and/or bolt holes that align with holes on busbar 110 such that the second position may be facilitated (e.g., when the indicated bolts of second mounting features 212 are used to bolt busbar 110 to the correspondingly indicated bolt holes).

It will be appreciated that, although the example implementation of relocation mechanism 112 shown and discussed with regard to FIGS. 2B-2D (and FIGS. 2E-2F, further below) may include fastening mechanisms such as bolts and/or bolt holes, a repositioning mechanism for repositioning busbar 110 between the two positions may be supplemented by manual manipulation of busbar 110's position with regard to rack 101. Other cases that include other example implementations of relocation mechanism 112 may include any number of repositioning mechanisms and/or any number of fastening mechanisms not to be limited by embodiments discussed herein.

Figure 2E:
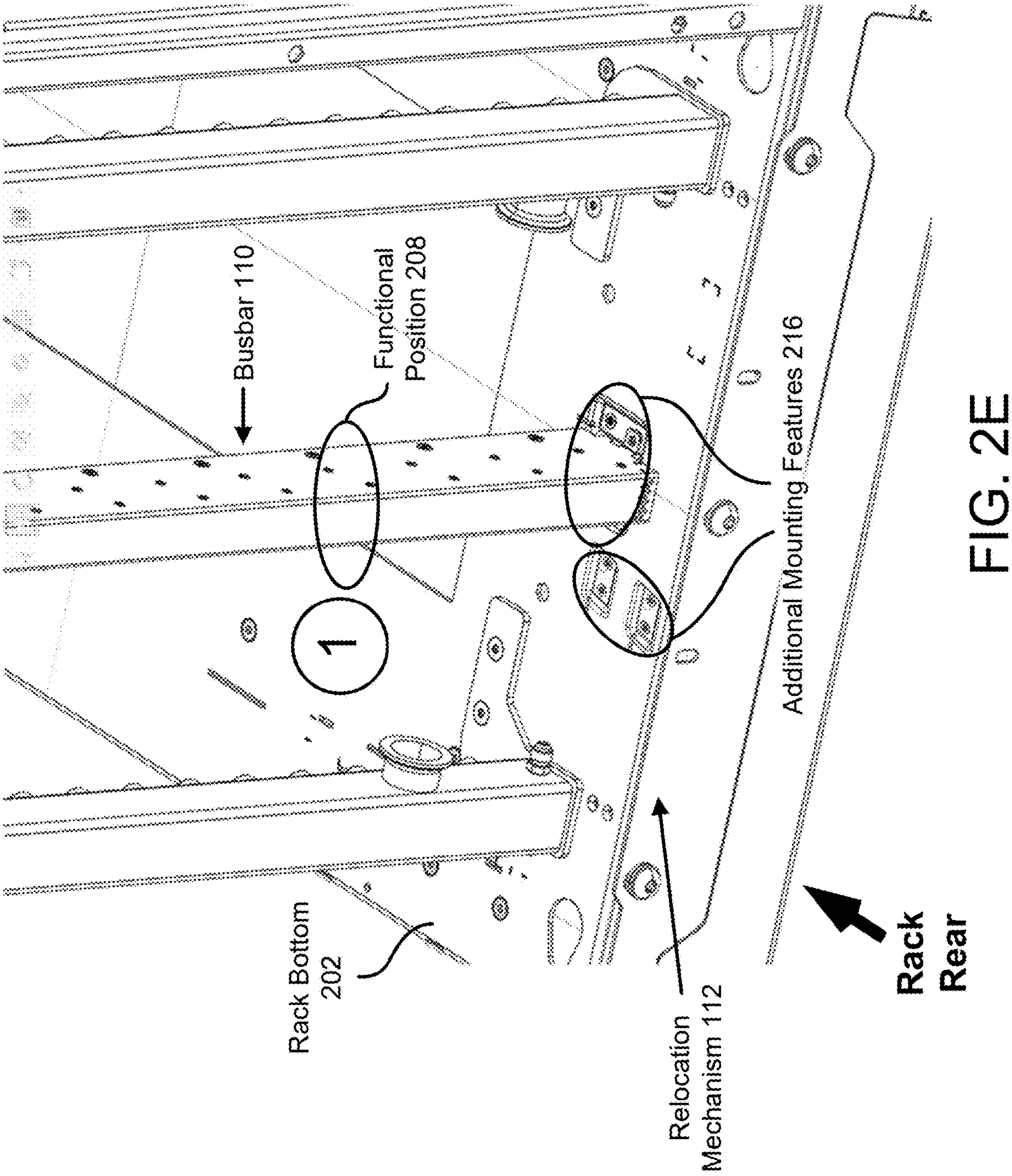
Figure 2F:
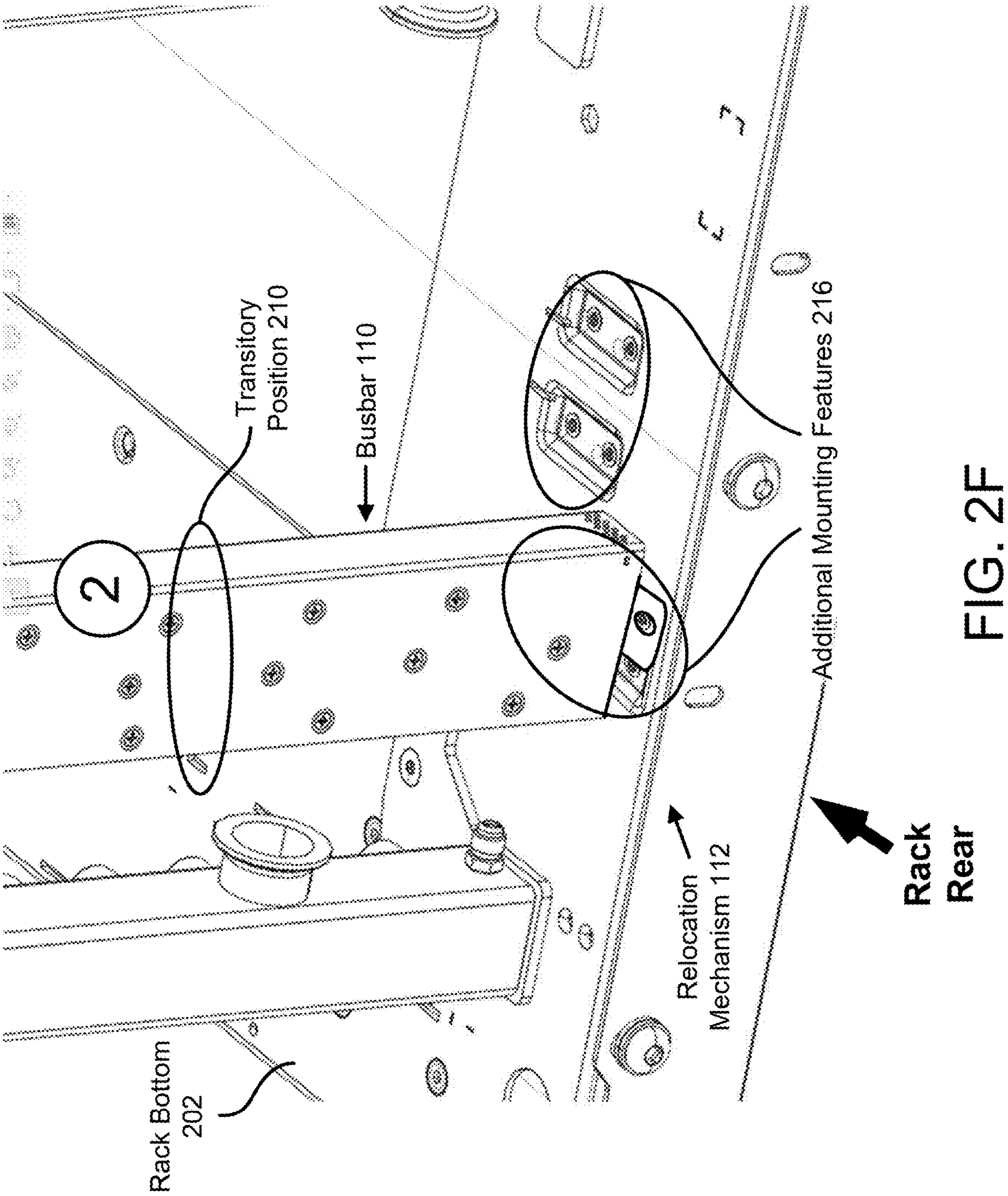

Turning to FIGS. 2E-2F, a fifth structural diagram and a sixth structural diagram in accordance with an embodiment are shown, respectively. The fifth and the sixth structural diagrams may each illustrate an expanded view of those depicted in FIGS. 2A and 2B, respectively. This expanded view may be of a bottom portion of relocation mechanism 112 shown in FIGS. 2A and 2B.

Turning to FIG. 2E, the fifth structural diagram in accordance with an embodiment is shown. The fifth structural diagram may illustrate structural components within the system of FIG. 1A that may contribute to the deployment framework.

To again reference what has been previously discussed, relocation mechanism 112 may be implemented by any number of mounting features. As shown in FIG. 2E, for example, relocation mechanism 112 may be implemented, at least in part, by a third sub-portion of the sub-portions. This third sub-portion may include additional mounting features 216.).

Similar to the mounting features discussed in FIGS. 2C-2D, additional mounting features 216 of relocation mechanism 112 may be adapted to fasten, at least in part, busbar 110 to either the first position as shown in FIG. 2E, or the second position as shown in FIG. 2F, further below. However, additional mounting features 216 may do so proximate to rack bottom 202 rather than near rack ceiling 204 as shown and discussed previously with regard to FIGS. 2C-2D.

It will be further appreciated that additional mounting features 216 may facilitate fastening of busbar 110 via bolts and/or bolt holes positioned with lateral sides of a housing of busbar 110 to fixedly secure this housing to rack 101. These positions of the bolts and/or bolt holes of additional mounting features 216 also being in a same position relative to the housing of busbar 110 when busbar 110 is in either transitory position 210 or functional position 208.

Turning to FIG. 2F, the sixth structural diagram in accordance with an embodiment is shown. The sixth structural diagram may illustrate structural components within the system of FIG. 1A that may contribute to the deployment framework.

As discussed above, additional mounting features 216 of relocation mechanism 112 may be adapted to fasten, at least in part, busbar 110 to either the first position as shown in FIG. 2E, or the second position as shown in FIG. 2F.

As shown in FIG. 2F, for example, busbar 110 may be a sufficient distance away from conductive components of rack 101 (even when the chassis are located in their respective operable positions) when busbar 110 is in transitory position 210 such that electrical pathways are not unintentionally facilitated by physical contact between the conductive portions of rack 10, nor does the usual physical contact of busbar 110 while busbar 110 is in functional position 208 risk damaging conductive components of rack system 100 (e.g., the power connections, busbar 110, operable connections of the chassis, etc.). This sufficient distance may therefore prevent unintended physical damage due to discharge of electricity, physical impacts between conductive surfaces, and/or abrasions to the surfaces/coatings of rack system 100.

If such unintentional impacts are successfully prevented, then a likelihood of providing computer implemented services that depend on an integrity of rack system 100 (and/or component thereof) being maintained may be increased.

Figure 2G:
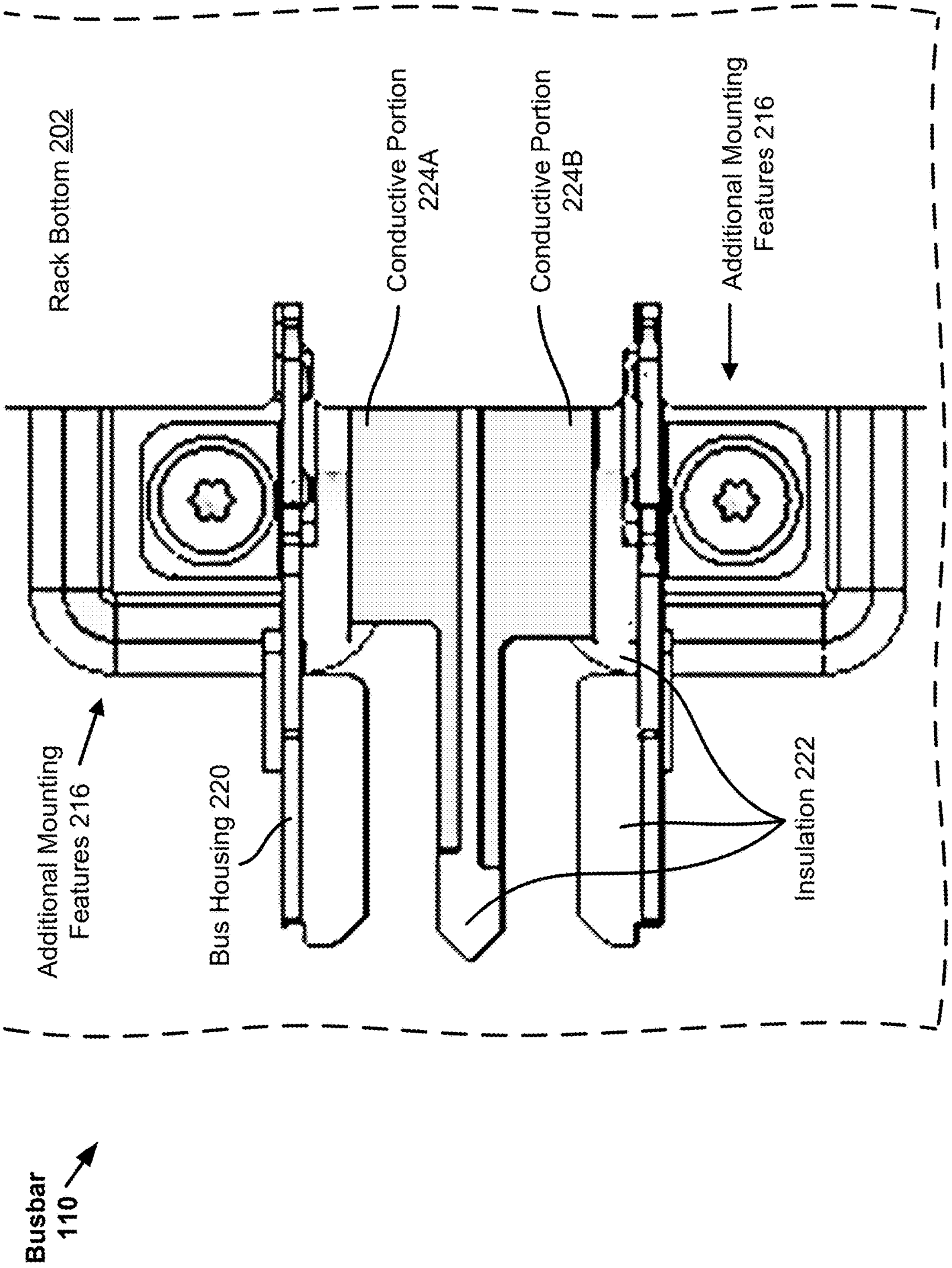

Turning to FIG. 2G, a seventh structural diagram in accordance with an embodiment is shown. The seventh structural diagram may illustrate a top-down view (with a top side of rack bottom 202 facing out of the page and the rack rear facing a bottom of the page) of that depicted in FIGS. 2A-2B and FIGS. 2E-2F. This top-down view may be used to clarify an orientation of busbar 110 within an embodiment.

For example, while in the second position (e.g., transitory position 210), busbar 110 may be oriented such that the housing of busbar 110 may be fasten-able via the bolts and/or bolt holes of additional mounting features 216, as previously discussed above with regard to FIGS. 2E-2F. These bolts and bolt holes may be used to, for example, fixedly secure the bottom of busbar 110 into the page, and therefore, fixedly secure busbar 110 to rack bottom 202.

Additionally, while in transitory position 210, conductive surfaces of busbar 110 may not face directly toward the power connections (positioned outside a viewpoint of FIG. 2G and toward a top of the page) as they would normally do when busbar 110 is in functional position 208 to facilitate the distribution of power when the power connections make physical contact with busbar 110. This may be due to the conductive surfaces of busbar 110 needing to face the power connections should physical contact with the power connections be intended/required.

For additional information regarding portions of busbar 110, continue below.

For example, to provide its functionality, busbar 110 may include bus housing 220, insulation 222, conductive portion 224A, and conductive portion 224B. Each of these is discussed below.

It will be appreciated that, although busbar 110 is depicted as being in transitory position 210 in FIG. 2F, functionality of busbar 110's portions may be discussed with regard to busbar 110 being in either of its previously discussed positions.

As previously discussed, while in transitory position 210 or functional position 208, the housing of busbar 110 may be fasten-able via the bolts and/or the bolt holes of additional mounting features 216. For example, this housing may be implemented by bus housing 220.

Bus housing 220 may, for example, (i) at least partially house insulating and/or conductive materials of busbar 110, (ii) provide a stable (e.g., unmalleable) structure for busbar 110, the structure being adapted to maintain a relative shape of busbar 110 (e.g., before, during, and after deployment), (iii) have a general shape, extended members, and/or other characteristics adapted to interact with relocation mechanism 112 to facilitate attachment and/or detachment of busbar 110 to and/or from rack bottom 202, (iv) facilitate and/or prevent deliberate (e.g., specific) physical contact between housed portions of busbar 110 and the power connections based on a position of busbar 110 and positions of the chassis in rack 101.

To provide its functionality, bus housing 220 may be implemented by an enclosure that at least partially surrounds the insulating and conductive portions of busbar 110. For example, bus housing 220 may be of a same material as that of the chassis positioned in rack 101.

Insulation 222 may include any number of materials positioned between bus housing 220 and the conductive portions of busbar 110. For example, the insulating materials may be adapted to prevent an electrical current from traveling between bus housing 220 and the conductive portions, thereby limiting a traversal path of any electrical current traversing through busbar 110 to an intended and/or predictable path. For example, by being limited to this path, an entity (and/or other components in a shared environment of the rack system) may be less likely to be negatively impacted in a physical manner (e.g., a manner resulting in injuries to the client and/or damages to the rack system).

To provide its functionality, insulation 222 may be implemented by insulating materials that prevent and/or are otherwise maladapted for conducting electricity.

Conductive portions 224A and 224B may obtain power provided by the power shelves and/or distribute that power throughout the rack system. For example, conductive portion 224A may be adapted to facilitate the obtaining of the power, and conductive portion 224B may be adapted to redistribute the obtained power to the data processing systems in rack 101.

It will be appreciated that, while power is being collaboratively distributed by these conductive portions, any one of the two conductive portions may be the actual (and sole) distributor of the obtained power while the other of the two conductive portions may be the sole facilitator of the obtaining of the power in an embodiment.

To provide their functionalities, conductive portions 224A-224B may be implemented by conductive materials that promote and/or may otherwise be adapted for conducting electricity.

Thus, as discussed with regard to FIGS. 1A-2G, a rack system may include components with such functionalities as to facilitate the deployment framework. These components may include rack 101, any number of data processing systems (e.g., 102A-102N), connectors 103A-103N, any number of power shelves (e.g., 104A-104N), connectors 105A-105N, busbar 110, and relocation mechanism 112.

This deployment framework may thus decrease a likelihood of the rack system being negatively impacted during deployment to the location. More specifically, for example, power components of the rack system may be less likely to be physically damaged when this deployment framework is facilitated.

While illustrated in FIGS. 2A-2G with a limited number of specific components, a system may include additional, fewer, and/or different components without departing from embodiments disclosed herein.

As discussed above, the components of FIGS. 1A-2G may facilitate and/or perform various functionalities to facilitate the deployment framework. FIG. 3 illustrates a method that may be facilitated and/or performed by the components of FIGS. 1A-2G.

In the diagram discussed below and shown in FIG. 3, any of the operations may be repeated, performed in different orders, and/or performed in parallel with or in a partially overlapping in time manner with other operations.

Turning to FIG. 3, a flow diagram illustrating a method for deploying computing resources to a location in accordance with an embodiment is shown. The method may be performed, for example, by a rack system (e.g., 100) and/or any other entity.

At operation 300, a rack system that may include a busbar positioned to distribute power to data processing systems positioned in chassis that are housed in a rack of the rack system while the chassis are positioned in operable positions, the data processing systems, and a relocation mechanism adapted to move the busbar between a first position and a second position, while the busbar is in the first position the busbar is adapted to distribute power to the chassis, and while the busbar is in the second position the busbar is not adapted to distribute the power to the chassis is obtained.

The rack system may be obtained, for example, as a byproduct of manufacturing processes performed to provide complete information technology (IT) solutions. For example, assume a client requests for computer implemented services to be provided. Based on specific information regarding the request for such services, a complete IT solution for fulfilling the request may include obtaining portions of the rack system, mentioned above, and combining them into a single deployable payload to be deployed to the client (and/or a location determined by the client).

This single deployable payload, before being deployed, may be subjected to quality control testing and/or otherwise tested to provide an assurance that the rack system adheres to industry/manufacturing standards for such technology. For example, such testing may include (i) powering the rack system (using a power shelf adapted to supply device level power to the busbar, and the busbar being adapted to distribute the device level power to all of the data processing systems), (ii) performing an inventory of components of the rack system, (iii) performing test operations based on operation of such components, and (iv) comparing the performance with criteria associated with the industry/manufacturing standards. In some cases, completion of such testing may initiate termination of the distribution of power throughout the rack system.

To distribute the device level power to the data processing systems, the busbar may include two electrical bars adapted to be positioned vertically at a rear of the chassis. The busbar may include a clip compatible interface to which the power shelf and the data processing systems are adapted to interface. Each of the two electrical bars may include a conductive coating susceptible to wear via mechanical abrasion, the two electrical bars not being adapted to carry force as part of the rack system.

For example, assume that prior to the operations discussed below, the rack system is tested and is determined to meet all criteria requires for the deployment. It will be appreciated that due to testing of the rack system including powering of the rack system, that the rack system may continue to be powered upon completion of the testing. Therefore, to prepare for the rack system's deployment, the rack system may first be powered down (e.g., the distribution of power throughout the rack system may be terminated) so that portions of the rack system do not risk enabling unintended flow of electrical currents through components of the rack system.

Thus, the rack system may be obtained as discussed above.

At operation 302, the busbar is positioned in the second position using the relocation mechanism. The busbar may be positioned by (i) moving at least the chassis from the operable positions to inoperable positions to disconnect the data processing systems from the busbar, (ii) while the data processing systems are disconnected, actuating the relocation mechanism, and (iii) after actuating the relocation mechanism, moving the at least the chassis from the inoperable positions to the operable positions to secure the chassis in the rack for the moving of the rack system to the location.

For example, the chassis may not be secured while in the inoperable positions. Each of the data processing systems may include a clip adapted to flow power from the busbar to a corresponding one of the data processing systems. Therefore, while the busbar is in the first position and the chassis are in the operable positions, the clip is in direct physical contact with the busbar and may enable the distribution of power. While the busbar is not in the first position or while the chassis are not in the operable positions, the clip is not in direct physical contact with the busbar and the distribution of power may be prevented.

To actuate the relocation mechanism, mechanical connectors that secure the busbar to the rack in the first position may be removed. A force may be applied, for example, to a guide system that moves the busbar between the first position and the second position. Once in the second position, for example, the mechanical connectors may be used to secure the busbar to the rack.

At operation 304, the rack system is moved to the location while the busbar is positioned in the second position. The rack system may be moved by, for example, (i) packaging the rack system as a single deployable payload such that it arrives on site almost ready, if not ready, for its intended operation, (ii) shipping the packaged rack system to the location, and (iii) unpackaging the rack system at the location.

At operation 306, the busbar is positioned in the first position, after the rack system is moved to the location to facilitate provisioning of desired computer implemented services. The busbar may be positioned by a similar mechanism to that described with respect to operation 302.

The busbar may be positioned by (i) moving at least the chassis from the operable positions to inoperable positions to disconnect the data processing systems from the busbar, (ii) while the data processing systems are disconnected, actuating the relocation mechanism, and (iii) after actuating the relocation mechanism, moving the at least the chassis from the inoperable positions to the operable positions to secure the chassis in the rack for the providing of computer implemented services.

To actuate the relocation mechanism, mechanical connectors that secure the busbar to the rack in the second position may be removed. A second force (e.g., in a reverse direction from the previously mentioned force) may be applied, for example, to the guide system that moves the busbar between the first position and the second position. Once in the first position, for example, the mechanical connectors may be used to secure the busbar to the rack.

Once the busbar is positioned in the first position with the chassis in their respective operable positions, the rack system may be operably connected to any relevant systems as determined by the request and/or client. Once integrated with systems and devices that may be determined by the client, the rack system may be powered and used to provide the computer implemented services.

The method may end following operation 306.

Thus, using the method illustrated in FIG. 3, embodiments disclosed herein may manage deployment of systems to increase the likelihood of providing the computer implemented services as expected and/or desired by a client once deployed to the location for the client.

Any of the processes and/or components illustrated in and/or discussed with regard to FIGS. 1A-3 may be implemented with and/or used in conjunction with one or more computing devices.

Turning to FIG. 4, a block diagram illustrating an example of a data processing system (e.g., a computing device) in accordance with an embodiment is shown. For example, system 400 may represent any of data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high-level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-407 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random-access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a Wi-Fi transceiver, an infrared transceiver, a Bluetooth transceiver, a WiMAX transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid-state device (SSD). However, in other embodiments, the mass storage may primarily be implemented using a hard disk drive (HDD) with a smaller amount of SSD storage to act as an SSD cache to enable non-volatile storage of context state and other such information during power down events so that a fast power up can occur on re-initiation of system activities. Also, a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of embodiments disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components as such details are not germane to embodiments disclosed herein. It will also be appreciated that network computers, handheld computers, mobile phones, servers, and/or other data processing systems which have fewer components, or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope of the embodiments disclosed herein as set forth in the following claims. The specification and drawings are, accordingly, to be regarded in an illustrative sense rather than a restrictive sense.

What is claimed is:

1. A method for deploying computing resources to a location, the method comprising:

obtaining a rack system comprising:

a busbar positioned to distribute device level power to all data processing systems positioned in chassis that are housed in a rack of the rack system while the chassis are positioned in operable positions;

the data processing systems; and a relocation mechanism comprising a first mounting feature and a second mounting feature located on each of a rack ceiling and a rack bottom and adapted to move the busbar between a first position and a second position, while the busbar is in the first position the busbar is adapted to mount to the first mounting feature and distribute power to the chassis, and while the busbar is in the second position the busbar is not adapted to distribute the power to the chassis; and a power shelf adapted to supply the device level power to the busbar, wherein the busbar comprises two electrical bars adapted to be positioned vertically at a rear of the chassis to distribute the device level power to all of the data processing systems, and the busbar comprises a clip compatible interface to which the power shelf and the data processing systems are adapted to interface, and wherein each of the two electrical bars comprises a conductive coating susceptible to wear via mechanical abrasion, and the two electrical bars are not adapted to carry force as part of the rack system;

positioning the busbar in the second position using the relocation mechanism;

while the busbar is positioned in the second position, moving the rack system to the location; and after the rack system is moved to the location, positioning the busbar in the first position to facilitate provisioning of desired computer implemented services by:

interfacing, via the clip compatible interface, the busbar with the power shelf and the data processing systems; and supplying the device level power from the power shelf, via the power shelf, to the busbar; and supplying the device level power from the busbar, via the two electrical bars at the rear of the chassis, to all of the data processing systems.

2. The method of claim 1, wherein positioning the busbar comprises:

moving at least the chassis from the operable positions to inoperable positions to disconnect the data processing systems from the busbar; and while the data processing systems are disconnected, actuating the relocation mechanism.

3. The method of claim 2, wherein positioning the busbar further comprises:

after actuating the relocation mechanism, moving the at least the chassis from the inoperable positions to the operable positions to secure the chassis in the rack for the moving of the rack system to the location.

4. The method of claim 3, wherein the chassis are not secured while in the inoperable positions.

5. The method of claim 2, wherein actuating the relocation mechanism comprises at least one selected from a group of actions consisting of:

removing mechanical connectors that secure the busbar to the rack in the first position; and applying force to a guide system that moves the busbar between the first position and the second position.

6. The method of claim 1, wherein each of the data processing systems comprises a clip adapted to flow power from the busbar to a corresponding one of the data processing systems; while the busbar is in the first position and the chassis are in the operable positions, the clip is in direct physical contact with the busbar; and while the busbar is not in the first position the clip is not in direct physical contact with the busbar.

7. A rack system, comprising:

a rack for housing components of the rack system;

a busbar positioned in the rack to distribute device level power to all data processing systems positioned in chassis that are housed in the rack while the chassis are positioned in operable positions in the rack;

the data processing systems;

a relocation mechanism comprising a first mounting feature and a second mounting feature located on each of a rack ceiling and a rack bottom and adapted to move the busbar between a first position and a second position, while the busbar is in the first position the busbar is adapted to mount to the first mounting feature and distribute power to the chassis through the first mounting feature contacted to the rack bottom, and while the busbar is in the second position the busbar is not adapted to distribute the power to the chassis; and a power shelf adapted to supply the device level power to the busbar;

wherein the busbar comprises two electrical bars adapted to be positioned vertically at a rear of the chassis to distribute the device level power to all of the data processing systems, and the busbar comprises a clip compatible interface to which the power shelf and the data processing systems are adapted to interface, and wherein each of the two electrical bars comprises a conductive coating susceptible to wear via mechanical abrasion, and the two electrical bars are not adapted to carry force as part of the rack system.

8. The rack system of claim 7, wherein, while in the second position, the busbar is not in direct physical contact with clips used by the data processing systems to receive the power from the busbar while the chassis are in the operable positions.

9. The rack system of claim 7, wherein, while in the first position, the busbar is in direct physical contact with clips used by the data processing systems to receive the power from the busbar while the chassis are in the operable positions.

10. The rack system of claim 7, wherein the rack comprises:

a rail adapted to secure the data processing systems in the rack while the chassis are in the operable positions.

11. The rack system of claim 10, wherein the rail is not adapted to secure the data processing systems in the rack while the chassis are not in the operable positions.

12. The rack system of claim 7, wherein the relocation mechanism comprises at least one selected from a group consisting of:

mechanical connectors that secure the busbar to the rack in the first position; and a guide system that moves the busbar between the first position and the second position.

13. The rack system of claim 7, wherein the relocation mechanism is configured to be actuated between the second position and the first position while the data processing systems are disconnected from the busbar by moving at least the chassis from the operable positions to inoperable positions.

14. The rack system of claim 13, wherein, after actuation into the second position, the relocation mechanism is configured to allow at least the chassis to move from the inoperable positions to the operable positions to secure the chassis in the rack for the moving of the rack system to the location.

15. The rack system of claim 14, wherein the chassis are not secured while in the inoperable positions.

16. The rack system of claim 13, wherein the relocation mechanism is configured to be actuated by at least one selected from a group of actions consisting of:

removing mechanical connectors that secure the busbar to the rack in the first position; and applying force to a guide system that moves the busbar between the first position and the second position.

17. The rack system of claim 13, wherein the rack comprises:

a rail adapted to secure the data processing systems in the rack while the chassis are in the operable positions.

18. The rack system of claim 17, wherein the rail is not adapted to secure the data processing systems in the rack while the chassis are not in the operable positions.

19. The method of claim 1, wherein using the relocation mechanism to position the busbar in the second position comprises using mechanical connectors to secure the busbar to the rack in the first position.

20. The method of claim 1, wherein using the relocation mechanism to position the busbar in the second position comprises using a guide system to move the busbar between the first position and the second position.

* * * * *